(12) United States Patent
Fukasawa et al.

(10) Patent No.: US 12,184,243 B2
(45) Date of Patent: Dec. 31, 2024

(54) SEMICONDUCTOR DEVICE

(71) Applicant: Murata Manufacturing Co., Ltd., Kyoto-fu (JP)

(72) Inventors: Mikiko Fukasawa, Nagaokakyo (JP); Satoshi Goto, Nagaokakyo (JP); Shunji Yoshimi, Nagaokakyo (JP); Yuji Takematsu, Nagaokakyo (JP); Mitsunori Samata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 609 days.

(21) Appl. No.: 17/546,831

(22) Filed: Dec. 9, 2021

(65) Prior Publication Data

US 2022/0200548 A1 Jun. 23, 2022

(30) Foreign Application Priority Data

Dec. 18, 2020 (JP) ................................ 2020-210058

(51) Int. Cl.
*H03F 3/195* (2006.01)
*H01L 23/66* (2006.01)
*H03F 1/56* (2006.01)

(52) U.S. Cl.
CPC ............. *H03F 3/195* (2013.01); *H01L 23/66* (2013.01); *H03F 1/56* (2013.01); *H01L 2223/6655* (2013.01); *H03F 2200/451* (2013.01); *H03F 2200/468* (2013.01)

(58) Field of Classification Search
CPC ...... H03F 3/195; H03F 1/56; H03F 2200/451; H03F 2200/468; H03F 2200/447; H03F 1/302; H03F 1/52; H03F 3/245; H03F 1/30; H03F 3/19; H01L 23/66; H01L 2223/6655; H01L 24/13; H01L 2223/6677; H01L 2224/13082; H01L 25/16; H01L 23/34
USPC ........................................................ 330/295
See application file for complete search history.

(56) References Cited

U.S. PATENT DOCUMENTS

| 9,761,543 B1 * | 9/2017 | Male ...................... H10N 10/17 |
| 10,643,962 B1 * | 5/2020 | Ichitsubo .................. H03F 3/72 |
| 2015/0303971 A1 | 10/2015 | Reisner et al. |
| 2020/0185875 A1 | 6/2020 | Allouche et al. |

FOREIGN PATENT DOCUMENTS

| JP | H05-505466 A | 8/1993 |
| JP | 2004-159123 A | 6/2004 |
| JP | 2005-217222 A | 8/2005 |
| JP | 2006-286721 A | 10/2006 |
| JP | 2007-505513 A | 3/2007 |
| JP | 2007-173982 A | 7/2007 |
| JP | 2012-529244 A | 11/2012 |

(Continued)

*Primary Examiner* — Andrea Lindgren Baltzell
*Assistant Examiner* — Khiem D Nguyen
(74) *Attorney, Agent, or Firm* — Studebaker & Brackett PC

(57) ABSTRACT

A second member is joined in surface contact with a first surface of a first member including a semiconductor region made from an elemental semiconductor. The second member includes a radio-frequency amplifier circuit made from a compound semiconductor. A conductive protrusion projects from the second member toward a side opposite to the first member. The first member includes a temperature measurement element that detects a temperature.

20 Claims, 14 Drawing Sheets

(56) References Cited

FOREIGN PATENT DOCUMENTS

| JP | 2014-053365 A | 3/2014 |
| JP | 2021-506106 A | 2/2021 |
| WO | 2019-066987 A1 | 4/2019 |
| WO | 2019-108945 A1 | 6/2019 |

* cited by examiner

SEMICONDUCTOR DEVICE

CROSS-REFERENCE TO RELATED APPLICATION

This application claims benefit of priority to Japanese Patent Application No. 2020-210058, filed Dec. 18, 2020, the entire content of which is incorporated herein by reference.

BACKGROUND

Technical Field

The present disclosure relates to a semiconductor device.

Background Art

In electronic devices used in communications, such as mobile communications and satellite communications, RF front-end modules capable of both transmitting and receiving radio-frequency signals are incorporated. An RF front-end module includes, for example, a monolithic microwave integrated circuit (MMIC) element capable of amplifying radio-frequency signals, a control IC that controls a radio-frequency amplifier circuit, a switch IC, and a duplexer.

U.S. Patent Application Publication No. 2015/0303971 discloses a radio-frequency module made smaller by stacking a control IC on an MMIC. The radio-frequency module disclosed in Patent Document 1 includes the MMIC mounted on a module substrate and the control IC stacked on the MMIC. Electrodes of the MMIC, electrodes of the control IC, and electrodes on the module substrate are electrically coupled to each other by wire bonding.

SUMMARY

In a radio-frequency amplifier circuit, for example, a heterojunction bipolar transistor (HBT) is used. The HBT generates heat due to the occurrence of collector dissipation during operation. An increase in the temperature of the HBT due to heat generation in turn causes a further increase in collector current. When conditions for this positive feedback are satisfied, thermal runaway occurs in the HBT. To avoid thermal runaway in the HBT, an upper limit of output power of the HBT is set.

To implement higher-power radio-frequency amplifier circuits, it is desirable to improve characteristics of heat dissipation from a semiconductor device including, for example, an HBT. It is difficult for the radio-frequency module disclosed in U.S. Patent Application Publication No. 2015/0303971 to satisfy the recent demand for higher-power radio-frequency amplifier circuits.

Accordingly, the present disclosure provides a semiconductor device that enables an increase in characteristics of heat dissipation.

According to an aspect of the present disclosure, a semiconductor device is provided that includes a first member having a first surface and including a semiconductor region made from an elemental semiconductor; a second member joined in surface contact with the first surface of the first member and including a radio-frequency amplifier circuit made from a compound semiconductor; and a conductive protrusion projecting from the second member toward a side opposite to the first member. The first member includes a temperature measurement element configured to detect a temperature.

Two paths are formed that are a heat transfer path extending from the radio-frequency amplifier circuit of the second member to the first member through a junction interface between the first member and the second member and a heat transfer path extending from the second member via the conductive protrusion to a module substrate where the semiconductor device is mounted. This enables an increase in characteristics of heat dissipation from the radio-frequency amplifier circuit. The temperature measurement element is included in the first member, and the second member and the first member are in surface contact with each other, thus achieving an advantageous effect of making it likely that the temperature of the second member including the radio-frequency amplifier circuit is reflected in a detected value of temperature provided by the temperature measurement element.

DETAILED DESCRIPTION

First Embodiment

Figure 1:
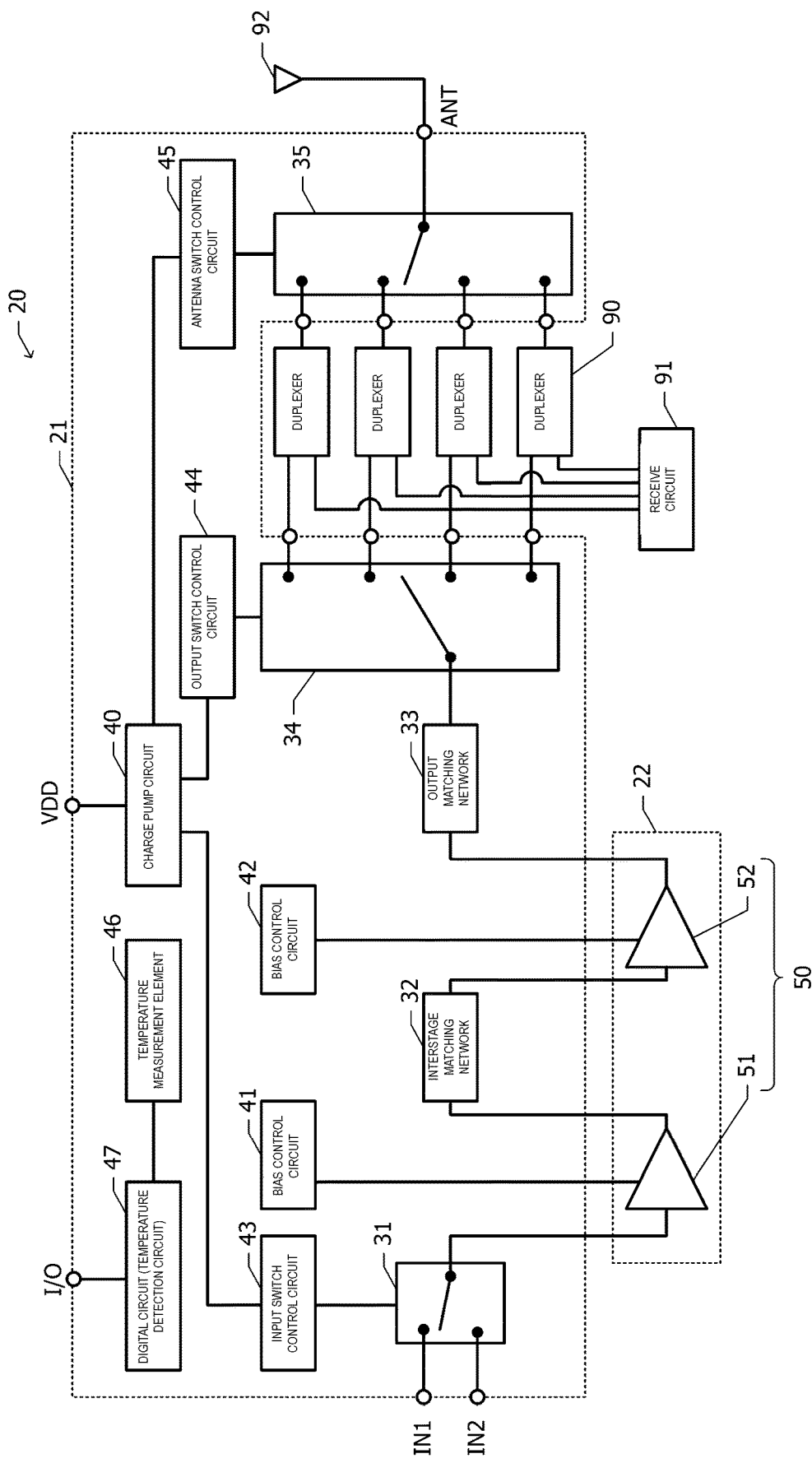
FIG. 1 is a block diagram of a semiconductor device according to a first embodiment.

A semiconductor device according to a first embodiment will be described with reference to FIGS. 1 to 5D. FIG. 1 is a block diagram of a semiconductor device 20 according to the first embodiment. The semiconductor device 20 according to the first embodiment includes a first member 21 and a second member 22. For example, the first member 21 is made from an elemental semiconductor, and the second member 22 is made from a compound semiconductor. The semiconductor device 20 is flip-chip mounted on a module substrate. A plurality of duplexers 90 and a receive circuit 91 are mounted in or on the module substrate. The semiconductor device 20 according to the first embodiment is used for communications based on a frequency division duplex (FDD) system.

The first member 21 includes an input switch circuit 31, an interstage matching network 32, an output matching network 33, an output switch circuit 34, an antenna switch circuit 35, a charge pump circuit 40, bias control circuits 41 and 42, an input switch control circuit 43, an output switch control circuit 44, an antenna switch control circuit 45, a temperature measurement element 46, and a digital circuit 47. Incidentally, as another configuration example, the input switch circuit 31, the interstage matching network 32, the output matching network 33, the output switch circuit 34, and the antenna switch circuit 35 may be composed, for example, of surface mount components mounted on the module substrate or metal patterns within the module substrate. The second member 22 includes a radio-frequency amplifier circuit 50 with a two-stage configuration including a driver-stage amplifier circuit 51 and a power-stage amplifier circuit 52. Incidentally, the second member 22 may include the interstage matching network 32.

Two input contacts of the input switch circuit 31 are coupled to two respective input terminals IN1 and IN2 of the module substrate. The input switch control circuit 43 selects one input terminal from the two input contacts and causes a radio-frequency signal input to the selected input terminal to be input to the driver-stage amplifier circuit 51. The input switch circuit 31 is controlled by the input switch control circuit 43.

The radio-frequency signal amplified by the driver-stage amplifier circuit 51 is input to the power-stage amplifier circuit 52 via the interstage matching network 32. The radio-frequency signal amplified by the power-stage amplifier circuit 52 is input to an input contact of the output switch circuit 34 via the output matching network 33. The bias control circuits 41 and 42 control respective bias currents or bias voltages supplied to the driver-stage amplifier circuit 51 and the power-stage amplifier circuit 52.

The output switch circuit 34 selects one output contact from among a plurality of output contacts and causes the radio-frequency signal input to the input contact to be transmitted to the selected output contact. The plurality of output contacts of the output switch circuit 34 are coupled to respective transmit-signal input ports of the plurality of duplexers 90. The output switch circuit 34 is controlled by the output switch control circuit 44.

A plurality of circuit-side contacts of the antenna switch circuit 35 are coupled to respective transmit/receive common ports of the plurality of duplexers 90. The antenna switch circuit 35 selects one circuit-side contact from among the plurality of circuit-side contacts and couples the selected circuit-side contact to an antenna-side contact. The antenna switch circuit 35 is controlled by the antenna switch control circuit 45. The antenna-side contact of the antenna switch circuit 35 is coupled to an antenna terminal ANT of the module substrate. An antenna 92 is coupled to the antenna terminal ANT. Respective receive-signal output ports of the plurality of duplexers 90 are coupled to the receive circuit 91.

The radio-frequency signal amplified by the power-stage amplifier circuit 52 is emitted from the antenna 92 through the output matching network 33, the output switch circuit 34, and a duplexer 90. A receive signal received by the antenna 92 is input to the receive circuit 91 through the antenna switch circuit 35 and a duplexer 90.

The charge pump circuit 40 is coupled to a power supply terminal VDD of the module substrate. A voltage increased to a predetermined voltage by the charge pump circuit 40 is applied to the input switch control circuit 43, the output switch control circuit 44, and the antenna switch control circuit 45. Furthermore, a power supply voltage is applied from the power supply terminal VDD to the bias control circuits 41 and 42.

The temperature measurement element 46 measures temperature. A measurement result is input to the digital circuit 47 as an analog signal. As the temperature measurement element 46, for example, a semiconductor temperature sensor, such as a silicon diode, is used. The digital circuit 47 converts a measured value of temperature input from the temperature measurement element 46 into a digital value and outputs the digital value from a digital input-output terminal I/O. The digital circuit 47 functions as a temperature detection circuit that performs AD conversion of an analog measured value of temperature and outputs the converted value. Furthermore, the digital circuit 47 decodes a command input from the outside world and outputs a control signal to each control circuit in the first member 21.

Figure 2:
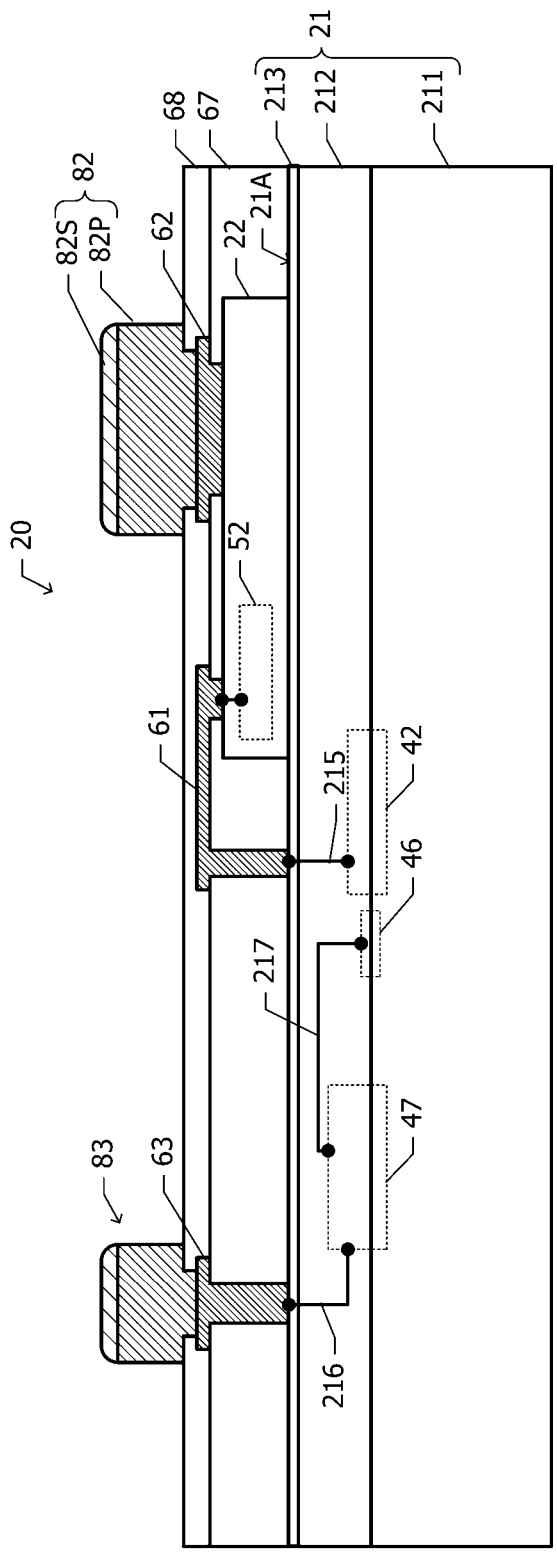
FIG. 2 is a schematic cross-sectional view of the semiconductor device according to the first embodiment.

FIG. 2 is a schematic cross-sectional view of the semiconductor device 20 according to the first embodiment. The first member 21 includes a substrate 211, a multilayer wiring structure 212 disposed on the substrate 211, and a first member protection film 213 covering the surface of the multilayer wiring structure 212. The substrate 211 includes a semiconductor region made from an elemental semiconductor. As the substrate 211, for example, a silicon substrate or silicon-on-insulator (SOI) substrate is used. A semiconductor element and a line constituting, for example, the input switch circuit 31 illustrated in FIG. 1 are composed of a semiconductor element formed at a surface layer portion of the substrate 211 and a line within the multilayer wiring structure 212. A passive element constituting, for example, the interstage matching network 32 is composed of a metal pattern within the multilayer wiring structure 212. The temperature measurement element 46 is composed of a diode formed at the surface layer portion of the substrate 211. In FIG. 2, regions where the bias control circuit 42, the digital circuit 47, and the temperature measurement element 46 are formed are surrounded by dashed lines.

The surface of the first member protection film 213 is regarded as a first surface 21A of the first member 21. The second member 22 is joined in surface contact with the first surface 21A of the first member 21. In FIG. 2, a region where the power-stage amplifier circuit 52 formed in the second member 22 is disposed is surrounded by a dashed line.

An interlayer insulating film 67 is disposed on the first surface 21A so as to cover the second member 22. A plurality of openings are provided at certain locations in the interlayer insulating film 67. On the interlayer insulating film 67, pads 62 and 63, and a line 61 are disposed. A wiring layer where the pads 62 and 63, and the line 61 are disposed may be referred to as a redistribution layer in some cases. The line 61 within the redistribution layer may be referred to as a redistribution line in some cases.

The line 61 passes through an opening provided in the interlayer insulating film 67 and is coupled to the bias control circuit 42 via a line 215 within the multilayer wiring structure 212. The line 61 also passes through another opening provided in the interlayer insulating film 67 and is coupled to the power-stage amplifier circuit 52. Within the redistribution layer, a plurality of other lines other than the line 61 are disposed. A line within the redistribution layer is used, for example, for coupling between the input switch circuit 31 and the driver-stage amplifier circuit 51 that are illustrated in FIG. 1.

The pad 62 is encompassed by the second member 22 in plan view and is coupled to a circuit formed in the second member 22. The other pad 63 is disposed outside the second member 22 in plan view and is coupled to the digital circuit 47 formed in the first member 21 via a line 216 within the multilayer wiring structure 212. The temperature measurement element 46 is coupled to the digital circuit 47 via a line 217 within the multilayer wiring structure 212.

A protection film 68 is disposed on the interlayer insulating film 67 so as to cover the redistribution layer. Openings through which partial regions of upper surfaces of the respective pads 62 and 63 are exposed are provided in the protection film 68. On the pads 62 and 63, conductive protrusions 82 and 83 are respectively disposed. The conductive protrusion 82 includes a Cu pillar 82P connected to the pad 62 and a solder layer 82S disposed on an upper surface of the Cu pillar 82P. The conductive protrusion 82 having such a structure is referred to as a Cu pillar bump.

With a view toward improving close contact, an under bump metal layer may be disposed on a bottom surface of the Cu pillar 82P. The other conductive protrusion 83 also has the same stacked structure as the conductive protrusion 82. Incidentally, for example, as the conductive protrusions 82 and 83, Au bumps, solder ball bumps, conductive posts erected on pads, or others may be used in place of Cu pillar bumps. A bump without any solder layer laid thereon, such as an Au bump, is also referred to as a pillar. A conductive post erected on a pad is also referred to as a post.

The conductive protrusion 82 is used, for example, for coupling between a ground conductor within the second member 22 and a ground conductor of the module substrate. A plurality of conductive protrusions other than the conductive protrusion 83 are disposed outside the second member 22 in plan view. These conductive protrusions are used, for example, for coupling between the input switch circuit 31 and the input terminals IN1 and IN2 that are illustrated in FIG. 1, and coupling between the output switch circuit 34 and the duplexers 90 that are illustrated in FIG. 1.

Figure 3A:
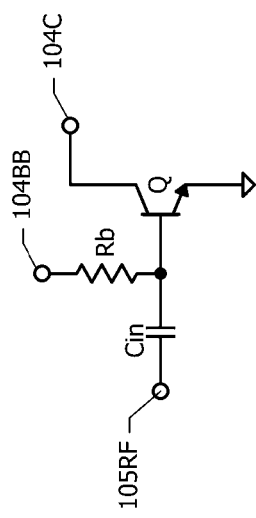
FIG. 3A is an equivalent circuit diagram of each of a plurality of cells constituting a power-stage amplifier circuit of the semiconductor device according to the first embodiment.

FIG. 3A is an equivalent circuit diagram of each of a plurality of cells constituting the power-stage amplifier circuit 52 (FIG. 1) of the semiconductor device 20 according to the first embodiment. The power-stage amplifier circuit 52 is constituted by a plurality of cells interconnected in parallel. Incidentally, the driver-stage amplifier circuit 51 (FIG. 1) has also the same circuit configuration as the power-stage amplifier circuit 52. Note that the number of cells constituting the driver-stage amplifier circuit 51 is smaller than the number of cells constituting the power-stage amplifier circuit 52.

Each cell includes a transistor Q, an input capacitor Cin, and a ballast resistance element Rb. A base of the transistor Q is coupled to a radio-frequency signal input line 105RF via the input capacitor Cin. Furthermore, the base of the transistor Q is coupled to a base bias line 104BB via the ballast resistance element Rb. An emitter of the transistor Q is grounded. A collector of the transistor Q is coupled to a collector line 104C. A power supply voltage is applied to the collector of the transistor Q via the collector line 104C, and an amplified radio-frequency signal is output from the collector.

Figure 3B:
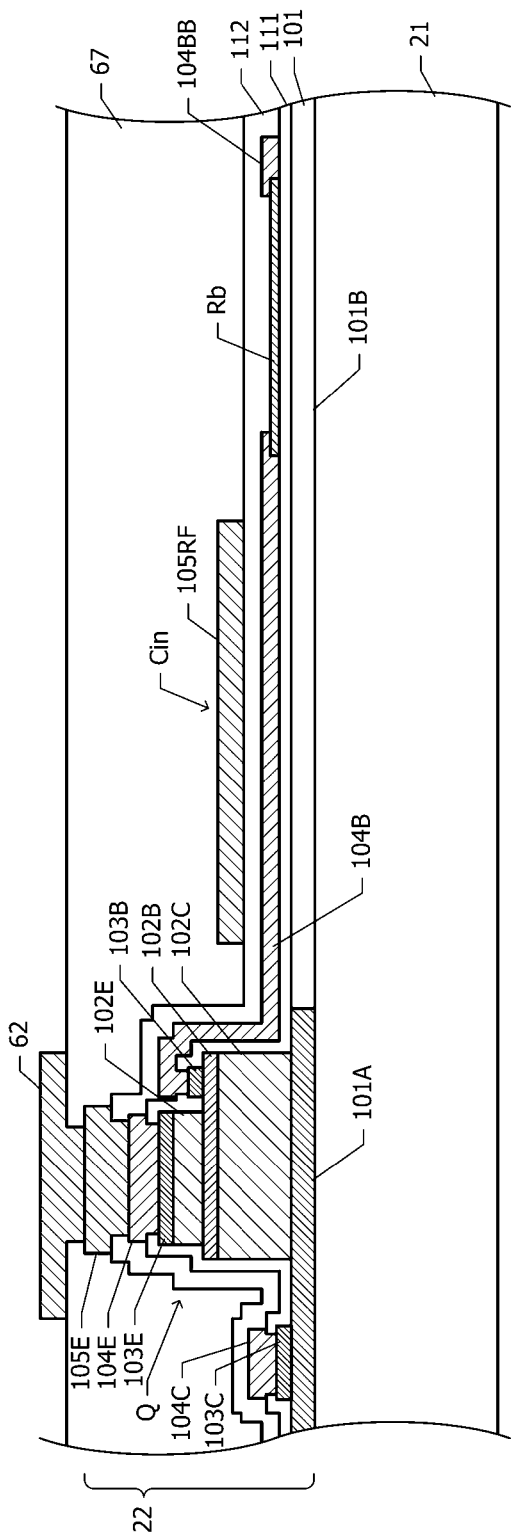
FIG. 3B is a schematic cross-sectional view of one cell constituting the power-stage amplifier circuit formed in a second member.

FIG. 3B is a schematic cross-sectional view of one cell constituting the power-stage amplifier circuit 52 (FIG. 1) formed in the second member 22. The second member 22 includes an underlying semiconductor layer 101. When the underlying semiconductor layer 101 is brought into surface contact with the first member 21, the second member 22 is joined to the first member 21. The underlying semiconductor layer 101 is divided into a conductive region 101A and an element isolation region 101B. For example, GaAs is used for the underlying semiconductor layer 101. The conductive region 101A is formed from n-type GaAs. The element isolation region 101B is formed by ion-implanting an impurity for isolation to an n-type GaAs layer.

On the conductive region 101A, the transistor Q is disposed. The transistor Q includes a collector layer 102C, a base layer 102B, and an emitter layer 102E that are stacked in sequence from the conductive region 101A. The emitter layer 102E is disposed on a partial region of the base layer 102B. For example, the collector layer 102C is formed from n-type GaAs, the base layer 102B is formed from p-type GaAs, and the emitter layer 102E is formed from n-type InGaP. That is, the transistor Q is a heterojunction bipolar transistor. As the transistor Q, a semiconductor element made from another compound semiconductor may be used.

On the base layer 102B, a base electrode 103B is disposed, and the base electrode 103B is electrically coupled to the base layer 102B. On the emitter layer 102E, an emitter electrode 103E is disposed, and the emitter electrode 103E is electrically coupled to the emitter layer 102E. On the conductive region 101A, a collector electrode 103C is disposed. The collector electrode 103C is electrically coupled to the collector layer 102C via the conductive region 101A.

A first-layer interlayer insulating film 111 is disposed on the underlying semiconductor layer 101 so as to cover the transistor Q, the collector electrode 103C, the base electrode 103B, and the emitter electrode 103E. The first-layer interlayer insulating film 111 is formed from an inorganic insulating material, such as SiN. At a certain plurality of locations in the interlayer insulating film 111, respective openings are provided.

On the interlayer insulating film 111, a first-layer emitter line 104E, a base line 104B, the collector line 104C, and the base bias line 104BB are disposed. Furthermore, on the interlayer insulating film 111, the ballast resistance element Rb is disposed. The emitter line 104E is coupled to the emitter electrode 103E through an opening provided in the interlayer insulating film 111. The base line 104B is coupled to the base electrode 103B through another opening provided in the interlayer insulating film 111. The collector line 104C is coupled to the collector electrode 103C through another opening provided in the interlayer insulating film 111.

The base line 104B extends to a region where the transistor Q is not disposed, and its end overlaps one end portion of the ballast resistance element Rb. In an overlapping portion, the base line 104B and the ballast resistance element Rb are electrically coupled to each other. The other end portion of the ballast resistance element Rb overlaps the base bias line 104BB. In an overlapping portion, the ballast resistance element Rb and the base bias line 104BB are electrically coupled to each other.

A second-layer interlayer insulating film 112 is disposed on the interlayer insulating film 111 so as to cover the first-layer emitter line 104E, the base line 104B, the base bias line 104BB, and the ballast resistance element Rb. The second-layer interlayer insulating film 112 is also formed from an inorganic insulating material, such as SiN.

On the interlayer insulating film 112, a second-layer emitter line 105E and the radio-frequency signal input line 105RF are disposed. The second-layer emitter line 105E is coupled to the first-layer emitter line 104E through an opening provided in the interlayer insulating film 112. A part of the radio-frequency signal input line 105RF overlaps the first-layer base line 104B in plan view. In an overlapping region where both of them overlap each other, the input capacitor Cin is formed.

The third-layer interlayer insulating film 67 is disposed so as to cover the second-layer emitter line 105E and the radio-frequency signal input line 105RF. The third-layer interlayer insulating film 67 is formed from an organic insulating material, such as polyimide. Incidentally, the third-layer interlayer insulating film 67 extends over the first member 21 as illustrated in FIG. 2.

The pad 62 is disposed on the third-layer interlayer insulating film 67. The pad 62 is coupled to the second-layer emitter line 105E through an opening provided in the interlayer insulating film 67.

Next, a method of manufacturing the semiconductor device 20 according to the first embodiment will be described with reference to FIGS. 4A to 5D. FIGS. 4A to 5C provide cross-sectional views of the semiconductor device 20 during a manufacturing process. FIG. 5D is a cross-sectional view of the finished semiconductor device 20.

Figure 4A:
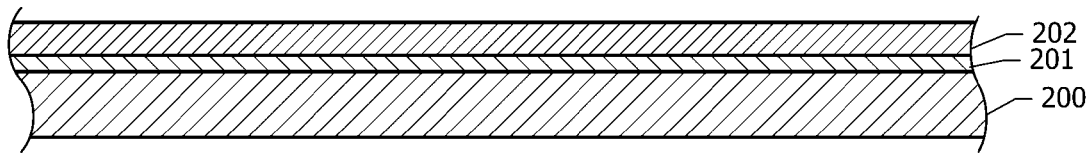
FIGS. 4A to 4F provide cross-sectional views of the semiconductor device during a manufacturing process.

As illustrated in FIG. 4A, a release layer 201 is epitaxially grown on a single-crystal base substrate 200 made from a compound semiconductor, such as GaAs, and an element formation layer 202 is formed on the release layer 201. For example, the underlying semiconductor layer 101, the transistor Q, a first-layer wiring layer, and a second-layer wiring layer that are included in the second member 22 illustrated in FIG. 3B are formed at the element formation layer 202. These circuit elements and wiring layers are formed by a typical semiconductor process. FIG. 4A does not illustrate an element structure formed at the element formation layer 202. In this stage, the element formation layer 202 is not yet divided into individual second members 22.

Figure 4B:
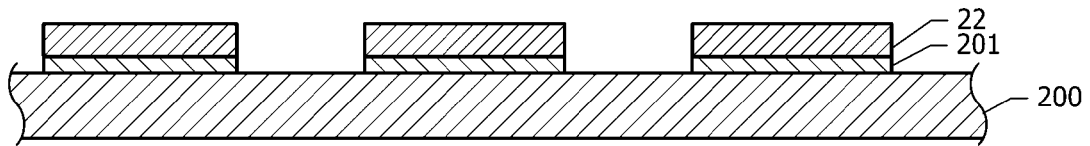

Next, as illustrated in FIG. 4B, the element formation layer 202 (FIG. 4A) and the release layer 201 are subjected to patterning by using a resist pattern (not illustrated) as an etch mask. In this stage, the element formation layer 202 (FIG. 4A) is divided into the individual second members 22.

Figure 4C:
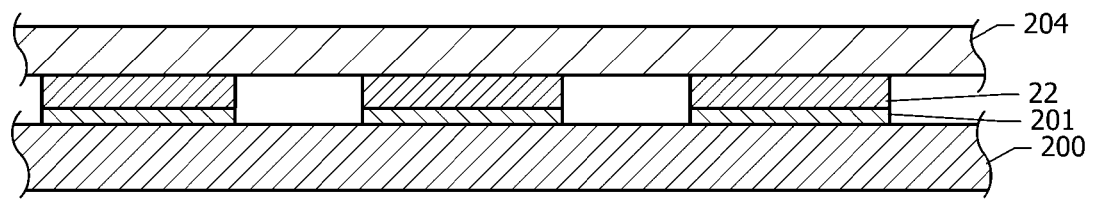

Next, as illustrated in FIG. 4C, a connecting support 204 is bonded onto the separate second members 22. Thus, the plurality of second members 22 are connected to each other via the connecting support 204. Incidentally, the resist pattern used as an etch mask in the patterning step of FIG. 4B may be left so that the resist pattern is interposed between each second member 22 and the connecting support 204.

Figure 4D:
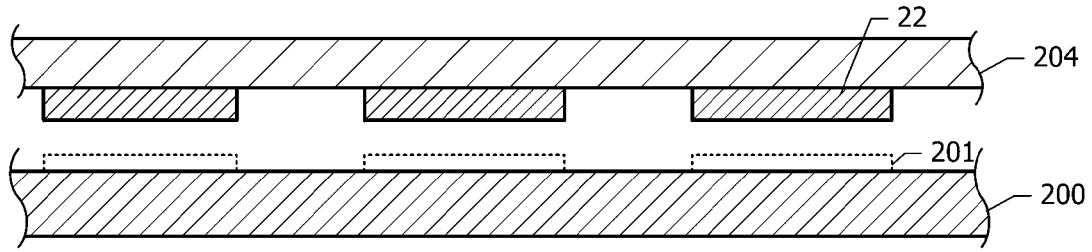

Next, as illustrated in FIG. 4D, the release layer 201 is selectively etched against the base substrate 200 and the second member 22. Thus, the second member 22 and the connecting support 204 are released from the base substrate 200. To selectively etch the release layer 201, as the release layer 201, a compound semiconductor is used that differs in etch resistance from both the base substrate 200 and the second member 22.

Figure 4E:
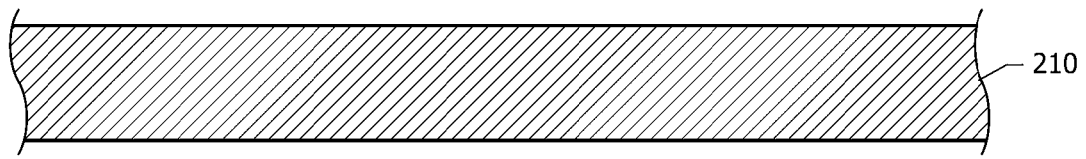

As illustrated in FIG. 4E, a substrate 210 is prepared where, for example, the bias control circuit 42 (FIG. 2), the temperature measurement element 46 (FIG. 2), the digital circuit 47 (FIG. 2), and the multilayer wiring structure 212 (FIG. 2) that are included in the first member 21 (FIG. 2) are formed. In this stage, the substrate 210 is not yet divided into individual first members 21.

Figure 4F:
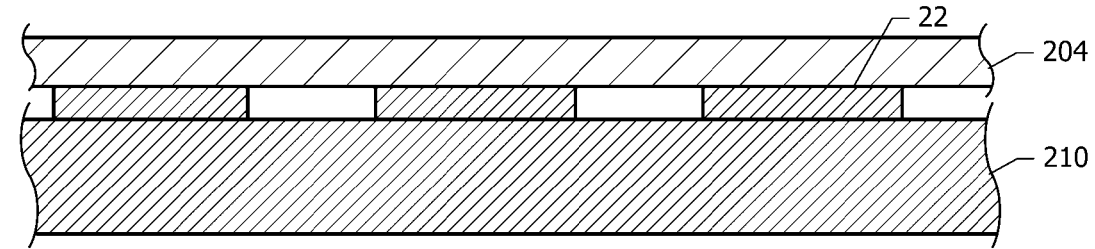

As illustrated in FIG. 4F, the second members 22 are joined to the substrate 210. The second members 22 and the substrate 210 are joined by van der Waals bonding or hydrogen bonding. Additionally, the second members 22 may be joined to the substrate 210, for example, by electrostatic forces, covalent bonding, or eutectic alloy bonding. For example, in a case where part of the surface of the substrate 210 is formed from Au, the second members 22 and the substrate 210 may be joined to each other by applying pressure with the second members 22 being kept in close contact with an Au region.

Figure 5A:
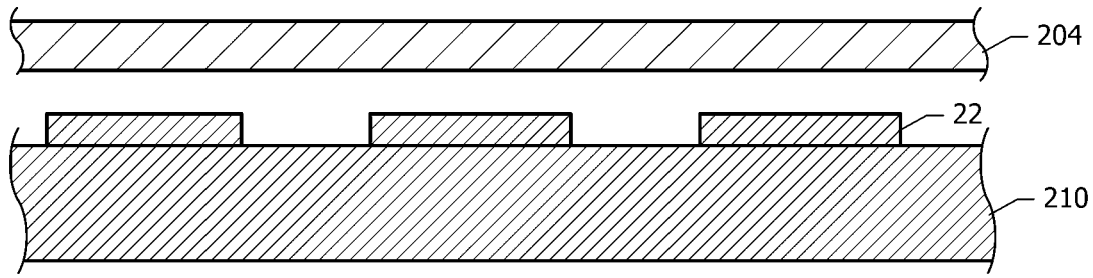
FIGS. 5A to 5C provide cross-sectional views of the semiconductor device during the manufacturing process.
Figure 5B:
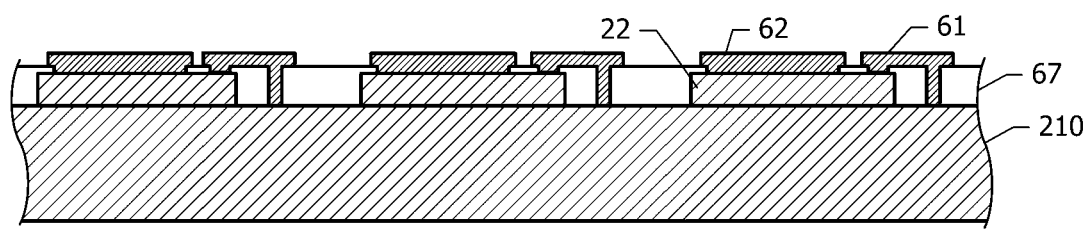

Next, as illustrated in FIG. 5A, the connecting support 204 is released from the second members 22. After the connecting support 204 is released, the interlayer insulating film 67 and the redistribution layer are formed over the substrate 210 and the second members 22 as illustrated in FIG. 5B. The redistribution layer includes, for example, the line 61, and the pads 62 and 63 (FIG. 2).

Figure 5C:
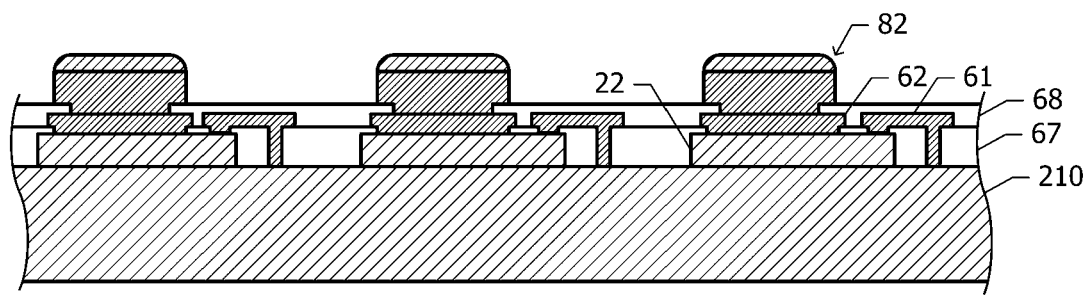
Figure 5D:
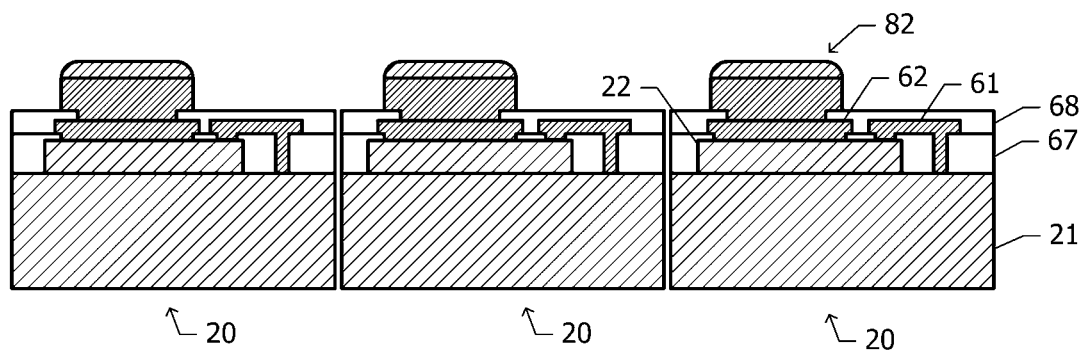
FIG. 5D is a cross-sectional view of the finished semiconductor device.

Next, as illustrated in FIG. 5C, the protection film 68 is formed on the redistribution layer, and openings are formed at certain locations in the protection film 68. Then, the conductive protrusion 82 is formed in an opening and on the protection film 68. The other conductive protrusion 83 (FIG. 2) and others are also formed simultaneously with the formation of the conductive protrusion 82.

Finally, as illustrated in FIG. 5D, the substrate 210 is cut with a dicing machine. Thus, the substrate 210 is divided into individual first members 21 to yield semiconductor devices 20.

Next, advantageous effects of the first embodiment will be described. A plurality of transistors Q (FIGS. 3A and 3B) constituting the power-stage amplifier circuit 52 formed in the second member 22 of the semiconductor device 20 (FIG. 1) according to the first embodiment serve as a heat generating source. In the first embodiment, as illustrated in FIG. 2, a heat transfer path extending from the second member 22 toward the first member 21 is formed. Since the second member 22 is in surface contact with the first member 21, the second member 22 and the first member 21 are thermally coupled by a low thermal resistance.

Heat transferred from the second member 22 to the first member 21 diffuses into the first member 21. The heat diffusing into the first member 21 is radiated outward from the surface of the first member 21. If the semiconductor device 20 is covered with a molding resin with being mounted on the module substrate, heat is transferred from the first member 21 to the molding resin.

Furthermore, the conductive protrusion 82 functions as a heat transfer path extending from the second member 22 to the module substrate. Thus, heat is dissipated through two paths that are the heat transfer path extending from the second member 22 toward the module substrate and the heat transfer path extending from the second member 22 toward the first member 21. This enables an increase in characteristics of heat dissipation from the second member 22. To achieve a sufficient effect of increasing characteristics of heat dissipation, it is desirable that a semiconductor, for example, an elemental semiconductor, such as Si or Ge, that is higher in thermal conductivity than a compound semiconductor forming a semiconductor element formed in the second member 22 is used for the semiconductor region in the substrate 211 of the first member 21. Furthermore, it is desirable that, as a semiconductor element formed in the second member 22, a semiconductor element made from a compound semiconductor that is higher in electron mobility than a semiconductor portion in the substrate 211 of the first member 21 is used for amplification of a radio-frequency signal.

To reduce the thermal resistance of the heat transfer path extending from the second member 22 to the first member 21, an opening may be provided in the first member protection film 213 and may be filled with a metal film. The second member 22 can be joined to this metal film. Furthermore, in a region overlapping the second member 22 in plan view, a metal pattern and a via that are included in the multilayer wiring structure 212 can be disposed. The heat transfer path with a low thermal resistance is formed by the metal film in the opening in the first member protection film 213, and the metal pattern and the via in the multilayer wiring structure 212.

Furthermore, in the first embodiment, the second member 22 is joined to the first member 21, thus enabling a reduction in the size of the module substrate in comparison with a configuration in which the first member 21 and the second member 22 are formed as different semiconductor chips and are separately mounted on the module substrate.

Furthermore, in the first embodiment, the temperature measurement element 46 (FIG. 2) is formed within the first member 21, and the second member 22 including the heat generating source is in surface contact with the first member 21. This facilitates transfer of heat generated in the second member 22 to the temperature measurement element 46. For this reason, the heat generated in the second member 22 is likely to be reflected in a measured value provided by the temperature measurement element 46. When the measured value provided by the temperature measurement element 46 is read out from the digital input-output terminal I/O (FIG. 1), the temperature of the second member 22 can be detected with high accuracy. Furthermore, since the temperature measurement element 46 is formed in the first member 21, the digital circuit 47 (temperature detection circuit) formed in the first member 21 and the temperature measurement element 46 can be easily coupled to each other.

In the configuration in which the first member 21 and the second member 22 are formed as different semiconductor chips and are separately mounted on the module substrate, the temperature measurement element 46 has to be formed in the second member 22 to measure the temperature of the second member 22 with high accuracy. In this configuration, the temperature measurement element 46 in the second member 22 and the digital circuit 47 (FIG. 1) in the first member 21 have to be coupled to each other with a line within the module substrate, thus complicating the wiring design of the module substrate. In the first embodiment (FIG. 1), the temperature measurement element 46 and the digital circuit 47 can be coupled to each other without a line within the module substrate with being confined to the semiconductor device 20. This can reduce complications in the wiring design of the module substrate.

Next, modifications to the first embodiment will be described. In the first embodiment, although one temperature measurement element 46 (FIG. 2) is disposed in the first member 21, a plurality of temperature measurement elements 46 may be disposed. When the plurality of temperature measurement elements 46 are disposed, information on temperature distribution within the first member 21 can be acquired.

In the first embodiment, although the semiconductor device 20 is used for communications based on the frequency division duplex (FDD) system, the semiconductor device 20 may be used for communications based on a time division duplex (TDD) system.

In order that the semiconductor device 20 can be used for communications based on the TDD system, a transmit/receive switch only has to be used as the output switch circuit 34. The transmit/receive switch includes two contacts and one common terminal. One of the two contacts is coupled to the power-stage amplifier circuit 52 via the output matching network 33 (FIG. 1), and the other contact is coupled to the receive circuit 91 (FIG. 1). Furthermore, in a case where communications based on the TDD system are performed, filters are mounted in or on the module substrate in place of the duplexers 90. The common terminal of the transmit/receive switch is coupled to the antenna terminal ANT via the filters.

Second Embodiment

Next, the semiconductor device 20 according to a second embodiment will be described with reference to FIG. 6. Hereinafter, a description of configurations that are the same as those of the semiconductor device 20 according to the first embodiment described with reference to FIGS. 1 to 5D is omitted.

Figure 6:
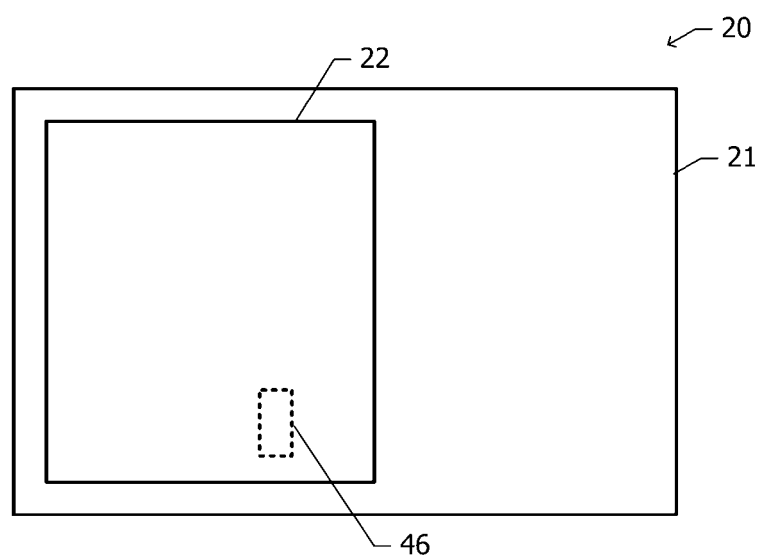
FIG. 6 illustrates a positional relationship between some components of the semiconductor device according to a second embodiment in plan view.

FIG. 6 illustrates a positional relationship between some components of the semiconductor device 20 according to the second embodiment in plan view. In the first embodiment, the location of the temperature measurement element 46 (FIG. 2) in a plane of the first member 21 (FIG. 2) is not limited to a particular location, and the temperature measurement element 46 is disposed at any location in the first member 21. On the other hand, in the second embodiment, the temperature measurement element 46 is disposed at a location where the temperature measurement element 46 overlaps the second member 22 in plan view.

Next, advantageous effects of the second embodiment will be described. In the second embodiment, since the temperature measurement element 46 is disposed at a location where the temperature measurement element 46 overlaps the second member 22 in plan view, a heat transfer path extending from the second member 22 to the temperature measurement element 46 is short. As a result, the temperature of the second member 22 is likely to be reflected in a detected value provided by the temperature measurement element 46. This can increase the accuracy of measurement of the temperature of the second member 22 further.

Third Embodiment

Next, the semiconductor device 20 according to a third embodiment will be described with reference to FIGS. 7A and 7B. Hereinafter, a description of a configuration that is the same as that of the semiconductor device 20 according to the second embodiment described with reference to FIG. 6 is omitted. In the second embodiment (FIG. 6), the temperature measurement element 46 is disposed at a location where the temperature measurement element 46 overlaps the second member 22 in plan view, whereas in the third embodiment, the location of the temperature measurement element 46 in plan view is further limited to a particular location.

Figure 7A:
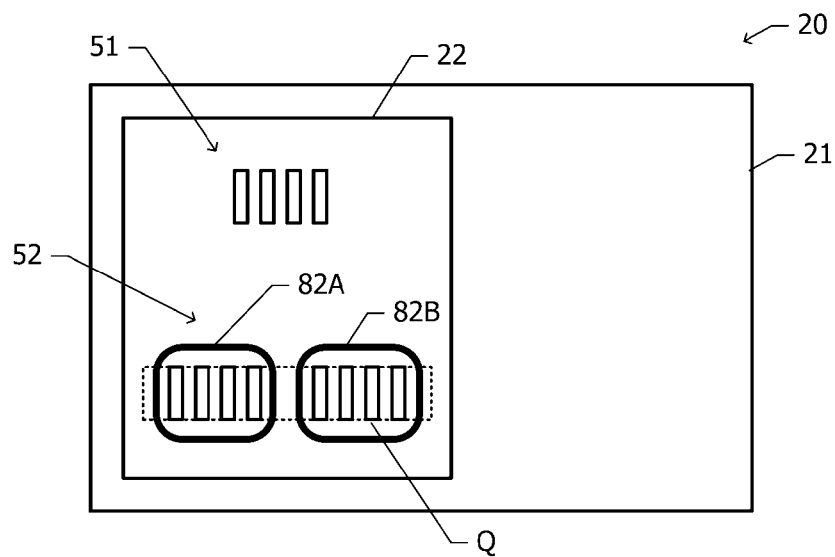
FIG. 7A illustrates a positional relationship between some components of the semiconductor device according to a third embodiment in plan view.

FIG. 7A illustrates a positional relationship between some components of the semiconductor device 20 according to the third embodiment in plan view. The second member 22 is encompassed by the first member 21 in plan view. In the second member 22, the driver-stage amplifier circuit 51 and the power-stage amplifier circuit 52 are disposed. The power-stage amplifier circuit 52 includes a plurality of transistors Q. Similarly, the driver-stage amplifier circuit 51 also includes a plurality of transistors.

Figure 7B:
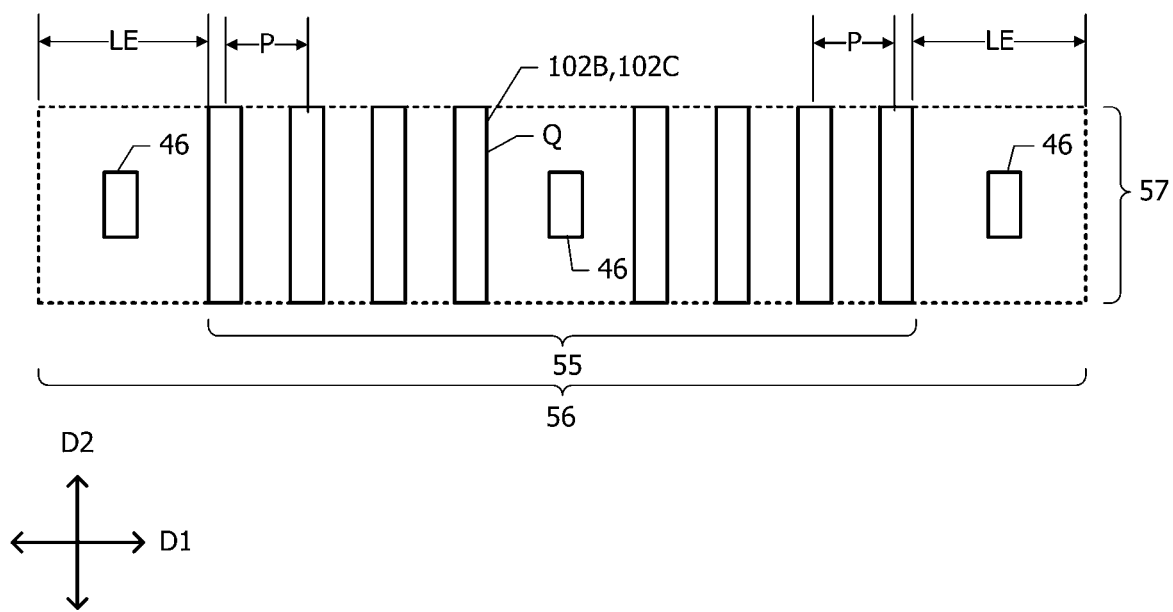
FIG. 7B illustrates the disposition of a plurality of transistors and temperature measurement elements in plan view.

FIG. 7B illustrates the disposition of the plurality of transistors Q and temperature measurement elements 46 in plan view. Of each of the plurality of transistors Q, the collector layer 102C and the base layer 102B substantially coincide in shape with each other in plan view and have a shape elongated in one direction (a vertical direction in FIG. 7B). That is, each of the plurality of transistors Q also has a shape elongated in the one direction in plan view. The plurality of transistors Q are arranged in a direction orthogonal to their respective longitudinal directions (in a horizontal direction in FIG. 7B, hereinafter referred to as a first direction D1) such that the longitudinal directions are parallel to one another. The longitudinal direction of each of the plurality of transistors Q is referred to as a second direction D2.

Next, a positional relationship between the plurality of transistors Q and temperature measurement elements 46 will be described. The plurality of transistors Q are arranged in the first direction D1 at equal pitches P. Some of distances between centers of the plurality of transistors Q are wider than an equal pitch P. In FIG. 7B, for example, a distance between centers in a central region of the row of the plurality of transistors Q arranged in the first direction D1 is slightly wider than the equal pitch P. Incidentally, all the transistors Q may be arranged at equal pitches P.

With respect to the first direction D1, in a range 56 obtained by extending a range 55 from a transistor Q at one end to a transistor Q at the other end at both ends in the first direction D1 by a length LE in the first direction D1, at least one temperature measurement element 46 is disposed. The length LE is less than or equal to three times the equal pitch P, and more preferably less than or equal to twice the equal pitch P. With respect to the second direction D2, in a range 57 where the plurality of transistors Q are disposed, a temperature measurement element 46 is disposed.

As illustrated in FIG. 7A, two conductive protrusions 82A and 82B for emitters are disposed so as to encompass the plurality of transistors Q in plan view. In the central region of the row of the plurality of transistors Q, at a place where a distance between centers of transistors Q is wider than the equal pitch P, the two conductive protrusions 82A and 82B are separated from each other. The conductive protrusions 82A and 82B are coupled to emitters of the plurality of transistors Q. Incidentally, the two conductive protrusions 82A and 82B may be connected to serve as one conductive protrusion.

Next, advantageous effects of the third embodiment will be described. In the third embodiment, a temperature measurement element 46 is disposed in close proximity to a transistor Q. Thus, the temperature measurement element 46 can increase the accuracy of measurement of the temperature of the transistor Q further.

Next, modifications to the third embodiment will be described. In the third embodiment, although the plurality of transistors Q are arranged in the first direction D1 at equal pitches P, the plurality of transistors Q do not necessarily have to be arranged at equal pitches. In a case where the plurality of transistors Q are not arranged at equal pitches, it is desirable that lengths LE extended from the transistors Q at both ends are equal to distances between centers of the transistors Q at the both ends and centers of transistors Q adjacent to the respective transistors Q at the both ends.

In the third embodiment, although the plurality of transistors Q (FIG. 7B) constituting the power-stage amplifier circuit 52 are arranged in a row, a plurality of transistor arrays each composed of a plurality of transistors Q may be arranged in a direction orthogonal to a direction in which the transistors Q are arranged. In this case, the ranges 55 and 56 where the transistors Q are disposed as illustrated in FIG. 7B may be defined for each transistor array.

Fourth Embodiment

Next, the semiconductor device according to a fourth embodiment will be described with reference to FIGS. 8 and 9. Hereinafter, a description of configurations that are the same as those of the semiconductor device according to the first embodiment described with reference to FIGS. 1 to 5D is omitted.

Figure 8:
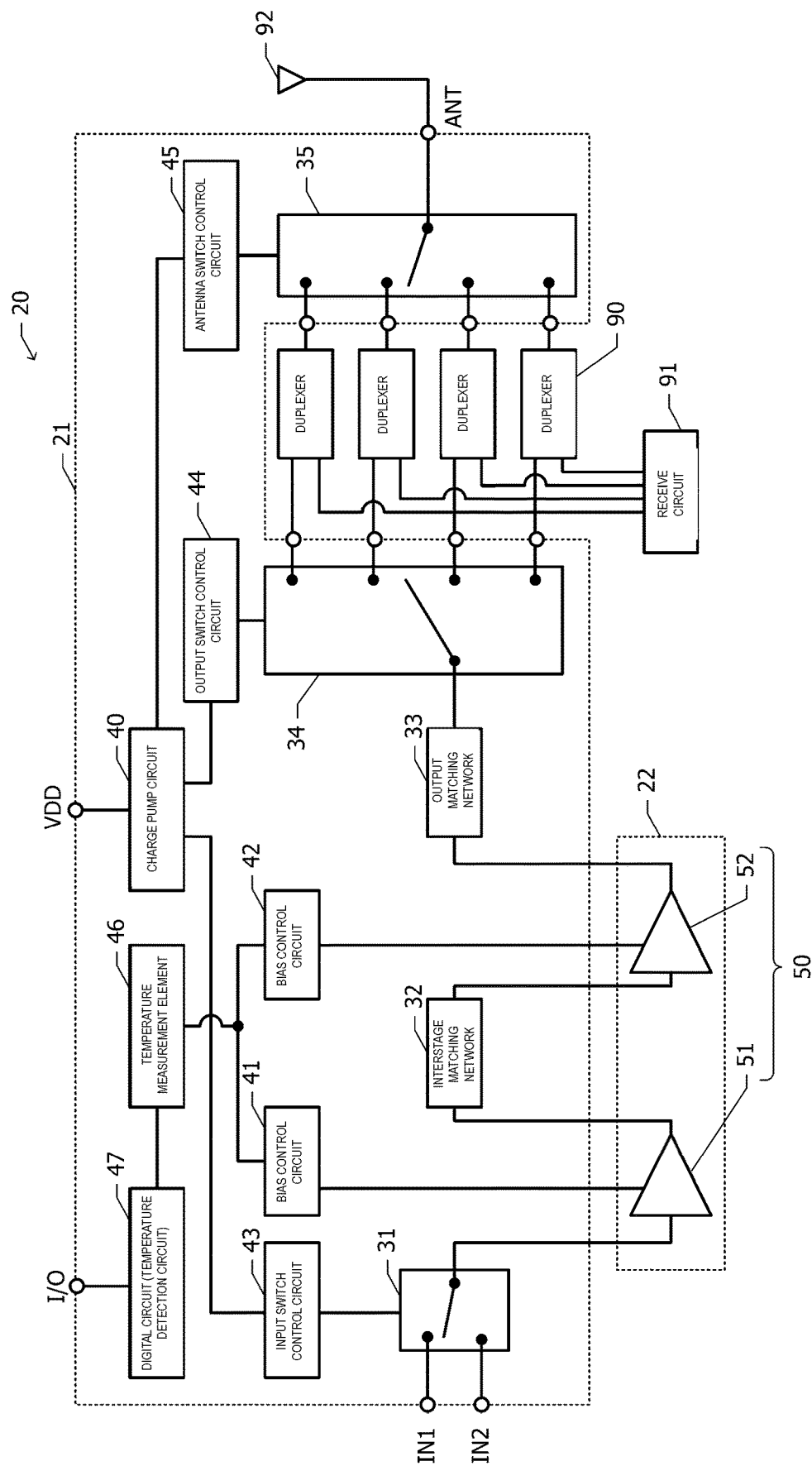
FIG. 8 is a block diagram of the semiconductor device according to a fourth embodiment.

FIG. 8 is a block diagram of the semiconductor device 20 according to the fourth embodiment. In the semiconductor device according to the fourth embodiment, a measured value of temperature provided by the temperature measurement element 46 is input to the bias control circuits 41 and 42 in addition to the digital circuit 47. The bias control circuit 41 changes, by using a detected value provided by the temperature measurement element 46, a bias current to be supplied to a transistor of the driver-stage amplifier circuit 51. The other bias control circuit 42 changes, by using a detected value provided by the temperature measurement element 46, a bias current to be supplied to the transistor Q (FIG. 3A) of the power-stage amplifier circuit 52.

Next, an example of a method of controlling a bias current will be described with reference to FIG. 9. FIG. 9 is a graph illustrating a dependence of the output of the transistor Q of the power-stage amplifier circuit 52 (FIG. 1) on temperature and the magnitude of a bias current that is changed in accordance with temperature. The horizontal axis represents the detected value of temperature provided by the temperature measurement element 46, the left vertical axis represents the output level of the transistor Q, and the right vertical axis represents bias current. In a case where the transistor Q is being operated at a fixed bias current, when the temperature of the transistor Q increases, the output level decreases as represented by a dashed line in FIG. 9 even if an input signal level is constant. The output of a transistor of the driver-stage amplifier circuit 51 also has a dependence on temperature similar to the output of the transistor Q of the power-stage amplifier circuit 52.

Figure 9:
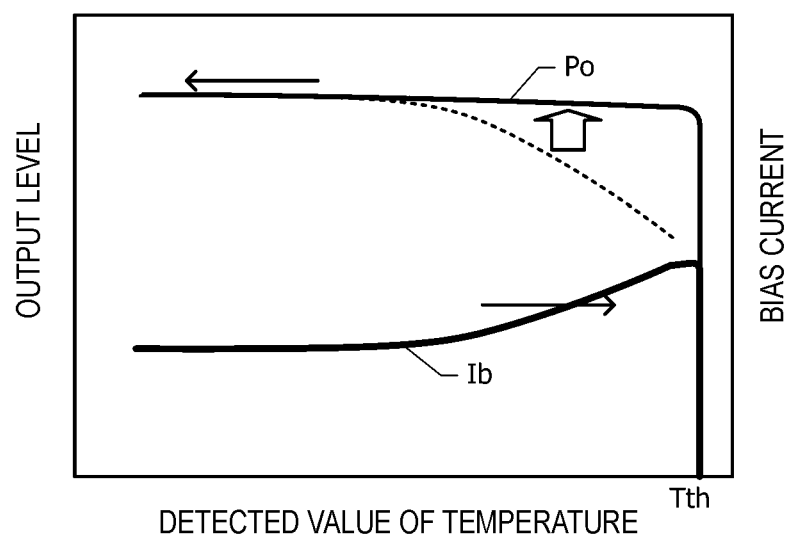
FIG. 9 is a graph illustrating a dependence of the output of a transistor of the power-stage amplifier circuit of the semiconductor device according to the fourth embodiment on temperature and the magnitude of a bias current that is changed in accordance with temperature.

As represented by a thick solid line in FIG. 9, the bias control circuit 42 (FIG. 1) increases a bias current Ib to be supplied to the transistor Q as the measured value of temperature provided by the temperature measurement element 46 increases. When the bias current Ib is increased, an output level Po of the transistor Q also increases as represented by a thin solid line in FIG. 9. Thus, a decrease in output level due to an increase in temperature is compensated for by an increase in bias current, and the output level Po of the transistor is brought close to a fixed value that is not dependent on temperature.

When the temperature further increases and exceeds an acceptable upper limit Tth, the bias control circuit 42 (FIG. 1) stops supply of a bias current to be supplied to the transistor Q of the power-stage amplifier circuit 52 (FIG. 1). Thus, the output level Po of the transistor Q also reaches nearly zero.

Control performed by the bias control circuit 41 for the driver-stage amplifier circuit 51 is similar to control performed by the bias control circuit 42 for the power-stage amplifier circuit 52.

Next, advantageous effects of the fourth embodiment will be described. In the fourth embodiment, a detected value of temperature provided by the temperature measurement element 46 is fed back to the bias control circuits 41 and 42, and a bias current to be supplied to the transistor Q is changed in accordance with the temperature. This can reduce a dependence of the output of the transistor Q on temperature to maintain the output level Po exhibited when the input signal level is constant nearly constant. Furthermore, when the temperature exceeds the acceptable upper limit Tth, destruction of the transistor Q due to an excessive increase in temperature can be inhibited by stopping supply of the bias current.

Next, modifications to the fourth embodiment will be described. In the fourth embodiment, bias currents to be supplied to all the transistors Q constituting the power-stage amplifier circuit 52 are uniformly changed. As a modification to the fourth embodiment, the plurality of transistors Q (FIG. 7B) arranged in the first direction D1 may be divided into a plurality of groups, and the temperature measurement element 46 may be disposed for each group. In this case, a bias current can be changed for each group in accordance with a measured value of temperature provided by each of a plurality of temperature measurement elements 46. For example, a bias current to be supplied to transistors Q of a group with a relatively high temperature can be made larger than a bias current to be supplied to transistors Q of a group with a relatively low temperature. This can reduce variations in output levels of all the transistors Q constituting the power-stage amplifier circuit 52.

Fifth Embodiment

Next, the semiconductor device according to a fifth embodiment will be described with reference to FIGS. 10 and 11. Hereinafter, a description of configurations that are the same as those of the semiconductor device according to the first embodiment described with reference to FIGS. 1 to 5D is omitted.

Figure 10:
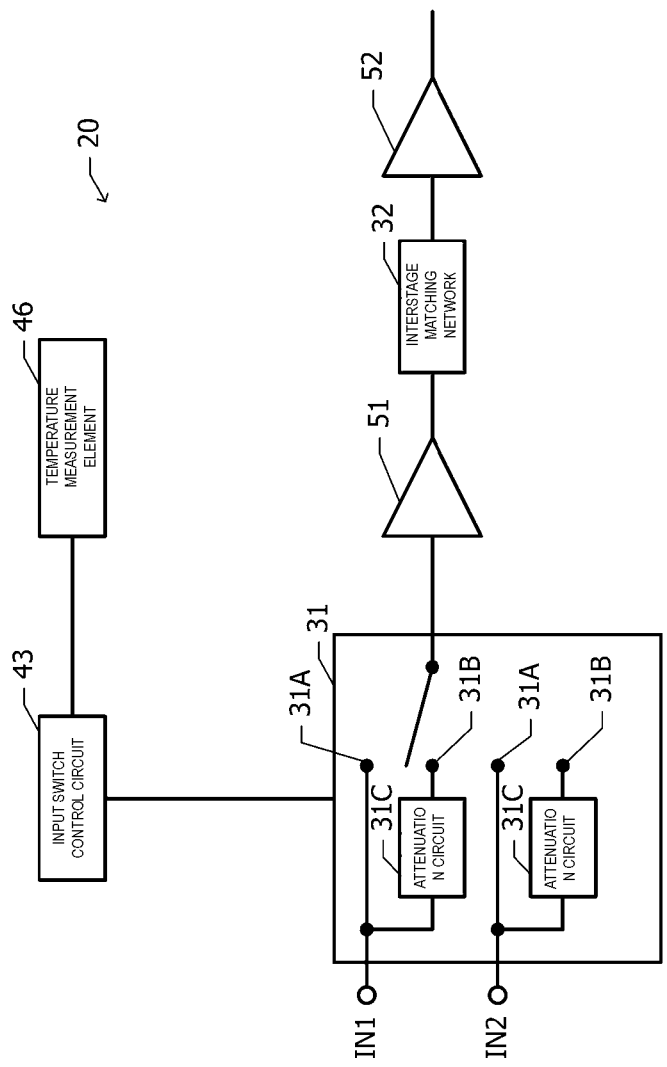
FIG. 10 is a block diagram illustrating some functions of the semiconductor device according to a fifth embodiment.

FIG. 10 is a block diagram illustrating some functions of the semiconductor device 20 according to the fifth embodiment. In the first embodiment (FIG. 1), the input switch circuit 31 includes one input contact for each of the two input terminals IN1 and IN2. On the other hand, in the fifth embodiment, the input switch circuit 31 includes two input contacts 31A and 31B for one input terminal IN1 and also includes two input contacts 31A and 31B for the other input terminal IN2. One input contact 31A is directly coupled to the input terminal IN1 or IN2. The other input contact 31B is coupled to the input terminal IN1 or IN2 via an attenuation circuit 31C.

The input switch control circuit 43 selects one input terminal from the two input terminals IN1 and IN2 and further selects either the input contact 31A or 31B in accordance with a detected value of temperature provided by the temperature measurement element 46. When one input contact 31A is selected, a radio-frequency signal input to the input terminal IN1 or IN2 is input to the driver-stage amplifier circuit 51 without being attenuated. When the other input contact 31B is selected, a radio-frequency signal input to the input terminal IN1 or IN2 is attenuated by the attenuation circuit 31C and is input to the driver-stage amplifier circuit 51. Furthermore, the input switch control circuit 43 puts the input switch circuit 31 into a non-conductive state to thereby enable input of a radio-frequency signal to the driver-stage amplifier circuit 51 to be stopped.

Figure 11:
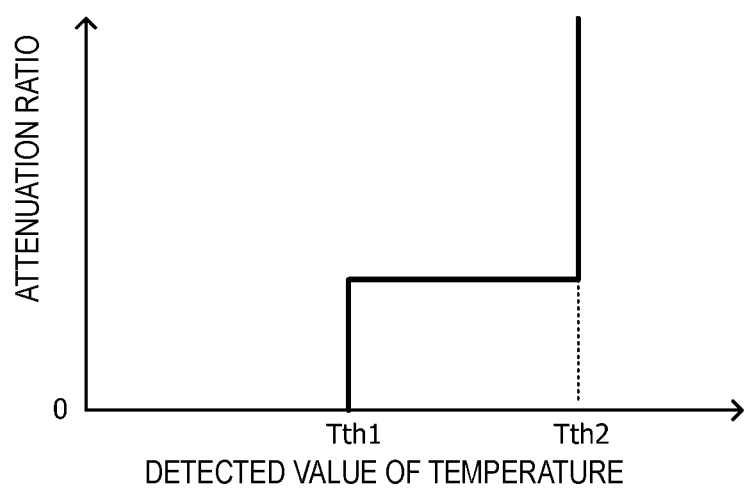
FIG. 11 is a graph illustrating a relationship between the attenuation ratio of a radio-frequency signal from an input terminal of the semiconductor device according to the fifth embodiment to a driver-stage amplifier circuit and a detected value of temperature provided by a temperature measurement element.

FIG. 11 is a graph illustrating a relationship between the attenuation ratio of a radio-frequency signal from the input terminal IN1 or IN2 to the driver-stage amplifier circuit 51 and a detected value of temperature provided by the temperature measurement element 46. The horizontal axis represents the detected value of temperature, and the vertical axis represents attenuation ratio. When the detected value of temperature is in a range of less than a first threshold Tth1, the input switch control circuit 43 selects the input contact 31A for which the attenuation circuit 31C is not inserted. For this reason, the attenuation ratio of the radio-frequency signal is nearly zero. When the detected value of temperature is in a range of not less than the first threshold Tth1 and less than a second threshold Tth2, the input switch control circuit 43 selects the input contact 31B for which the attenuation circuit 31C is inserted. For this reason, the attenuation ratio of the radio-frequency signal increases from zero.

When the detected value of temperature is in a range of not less than the second threshold Tth2, the input switch control circuit 43 puts the input switch circuit 31 into a non-conductive state. For this reason, input of the radio-frequency signal to the driver-stage amplifier circuit 51 is stopped. That is, the attenuation ratio of the radio-frequency signal becomes infinite.

Next, advantageous effects of the fifth embodiment will be described. In the fifth embodiment, when a detected value of temperature provided by the temperature measurement element 46 is fed back for control of the input switch circuit 31, the level of a radio-frequency signal input to the driver-stage amplifier circuit 51 is adjusted. When the detected value of temperature increases, a further increase in temperature can be inhibited by reducing the level of the radio-frequency signal input to the driver-stage amplifier circuit 51 or by reducing the level of the radio-frequency signal to zero. The input switch control circuit 43 and the input switch circuit 31 function as a protection circuit for keeping the transistor Q from being destroyed by an excessive increase in temperature.

Sixth Embodiment

Next, the semiconductor device according to a sixth embodiment will be described with reference to FIG. 12. Hereinafter, a description of configurations that are the same as those of the semiconductor device according to the first embodiment described with reference to FIGS. 1 to 5D is omitted.

Figure 12:
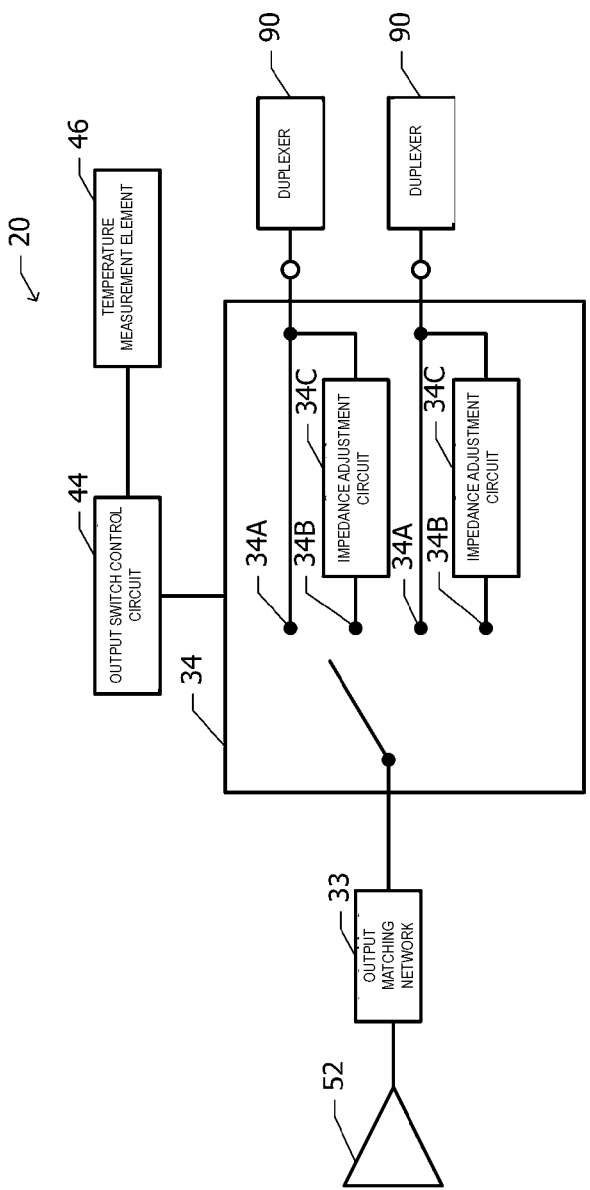
FIG. 12 is a block diagram illustrating some functions of the semiconductor device according to a sixth embodiment.

FIG. 12 is a block diagram illustrating some functions of the semiconductor device 20 according to the sixth embodiment. In the first embodiment (FIG. 1), the output switch circuit 34 includes one output contact for each duplexer 90. On the other hand, in the sixth embodiment, the output switch circuit 34 includes two output contacts 34A and 34B for each duplexer 90. One output contact 34A is directly coupled to a transmit-signal input port of the duplexer 90, and the other output contact 34B is coupled to the transmit-signal input port of the duplexer 90 via an impedance adjustment circuit 34C.

When the one output contact 34A is selected, a radio-frequency signal output from the power-stage amplifier circuit 52 is input to the transmit-signal input port of the duplexer 90 via the output matching network 33. At this time, matching of the load impedance as seen from the power-stage amplifier circuit 52 looking toward a load side to the output impedance of the power-stage amplifier circuit 52 has nearly been achieved. When the other output contact 34B is selected, a radio-frequency signal output from the power-stage amplifier circuit 52 is input to the transmit-signal input port of the duplexer 90 via the output matching network 33 and the impedance adjustment circuit 34C. At this time, the impedance adjustment circuit 34C is configured so that the impedance as seen from the power-stage amplifier circuit 52 looking toward the load side is made higher than the output impedance of the power-stage amplifier circuit 52.

The output switch control circuit 44 selects one duplexer 90 from among the plurality of duplexers 90 and also selects one output contact from the output contacts 34A and 34B in accordance with a detected value of temperature provided by the temperature measurement element 46.

Next, advantageous effects of the sixth embodiment will be described. In the sixth embodiment, when a detected value of temperature provided by the temperature measurement element 46 exceeds a certain threshold, the output switch control circuit 44 switches a coupling state of the output switch circuit 34 from a state in which the input contact is coupled to the one output contact 34A to a state in which the input contact is coupled to the other output contact 34B. This makes the impedance as seen from the power-stage amplifier circuit 52 looking toward the load side higher to reduce output current. A reduction in output current can inhibit destruction of the transistor Q of the power-stage amplifier circuit 52 due to an excessive increase in temperature.

Furthermore, when the level of a signal input to a duplexer 90 decreases, destruction of the duplexer 90 can be inhibited.

When the output of the power-stage amplifier circuit 52 increases, the temperature of the power-stage amplifier circuit 52 increases and the power of a radio-frequency signal input to the duplexer 90 also increases. As a result, a pass loss (insertion loss) in the duplexer 90 increases, and the temperature of the duplexer 90 also increases. Furthermore, when the temperature of the power-stage amplifier circuit 52 increases, heat of the power-stage amplifier circuit 52 is transferred to the duplexer 90, and the temperature of the duplexer 90 also increases. That is, it is considered that there is a correlation between the temperature of the power-stage amplifier circuit 52 and the temperature of the duplexer 90. Hence, it can be considered that the temperature of the duplexer 90 is also reflected in a detected value of temperature provided by the temperature measurement element 46. For this reason, the amount of shift in a pass frequency band due to a change in temperature of the duplexer 90 can be determined by using the detected value of temperature provided by the temperature measurement element 46, and impedance matching between the power-stage amplifier circuit 52 and the duplexer 90 can be adjusted in accordance with the amount of shift.

Seventh Embodiment

Next, the semiconductor device according to a seventh embodiment will be described with reference to FIG. 13. Hereinafter, a description of configurations that are the same as those of the semiconductor device according to the first embodiment described with reference to FIGS. 1 to 5D is omitted.

Figure 13:
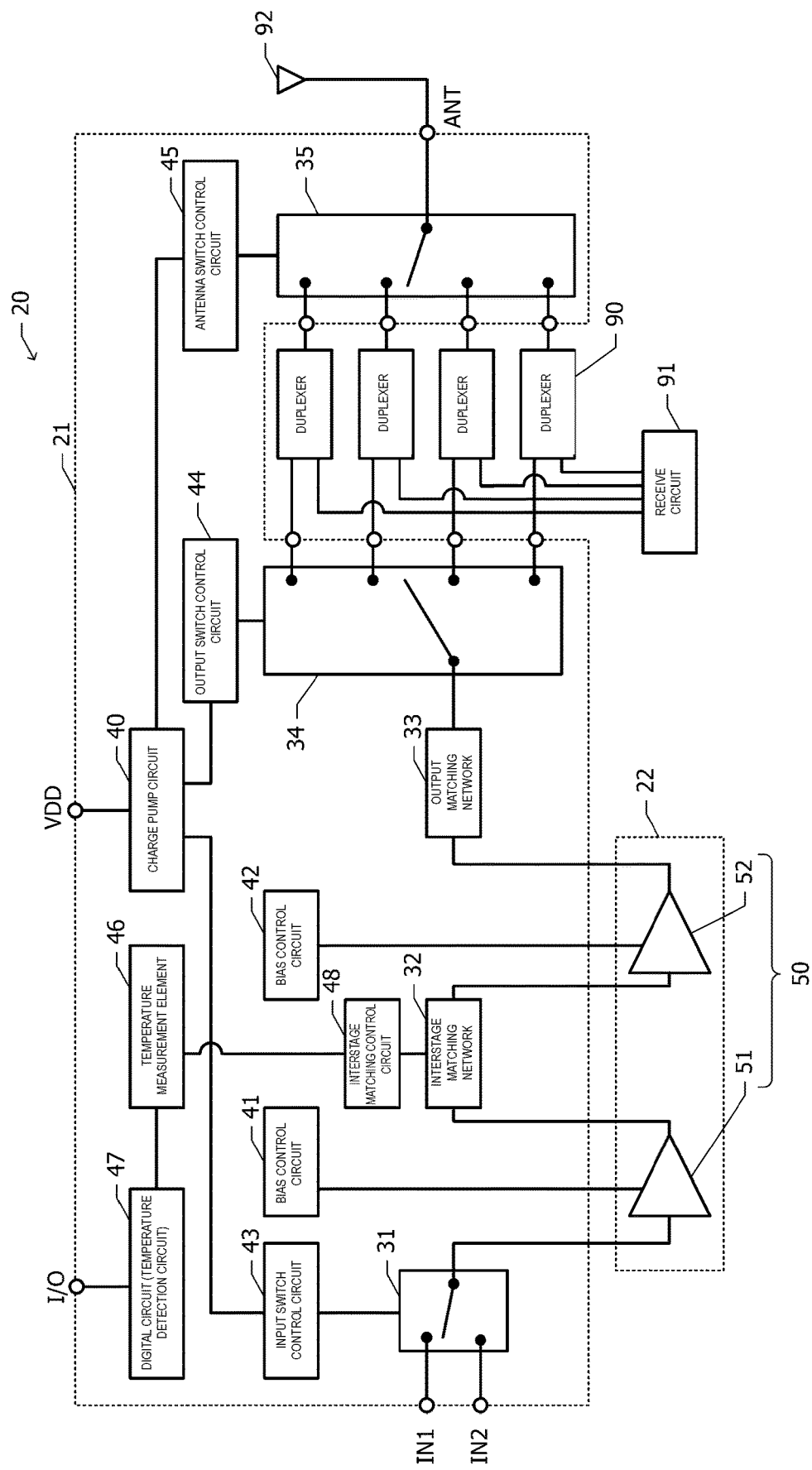
FIG. 13 is a block diagram of the semiconductor device according to a seventh embodiment.

FIG. 13 is a block diagram of the semiconductor device 20 according to the seventh embodiment. In the first embodiment (FIG. 1), an impedance transformation ratio of the interstage matching network 32 is a fixed value. On the other hand, in the seventh embodiment, the impedance transformation ratio of the interstage matching network 32 is variable. For example, a switch element is inserted in parallel or in series with at least one passive element included in the interstage matching network 32. The impedance transformation ratio can be changed by turning on or turning off this switch element. An interstage matching control circuit 48 included in the first member 21 controls turning on or turning off of the switch element of the interstage matching network 32 to thereby change the impedance transformation ratio of the interstage matching network 32.

For example, the interstage matching network 32 has two states: a matching state in which matching between the impedance as seen from the driver-stage amplifier circuit 51 looking toward the load side and the output impedance of the driver-stage amplifier circuit 51 has nearly been achieved; and a high impedance state in which the impedance as seen from the driver-stage amplifier circuit 51 looking toward the load side is higher than the output impedance of the driver-stage amplifier circuit 51.

When a measured value of temperature provided by the temperature measurement element 46 exceeds a certain threshold, the interstage matching control circuit 48 switches the state of the interstage matching network 32 from the matching state to the high impedance state.

Next, advantageous effects of the seventh embodiment will be described. When a measured value of temperature provided by the temperature measurement element 46 exceeds the threshold and the state of the interstage matching network 32 is switched to the high impedance state, the signal level of a radio-frequency signal input to the power-stage amplifier circuit 52 decreases. This can inhibit destruction of the transistor Q of the power-stage amplifier circuit 52 due to an excessive increase in temperature.

Eighth Embodiment

Next, the semiconductor device according to an eighth embodiment will be described with reference to FIG. 14. Hereinafter, a description of configurations that are the same as those of the semiconductor device according to the first embodiment described with reference to FIGS. 1 to 5D is omitted.

Figure 14:
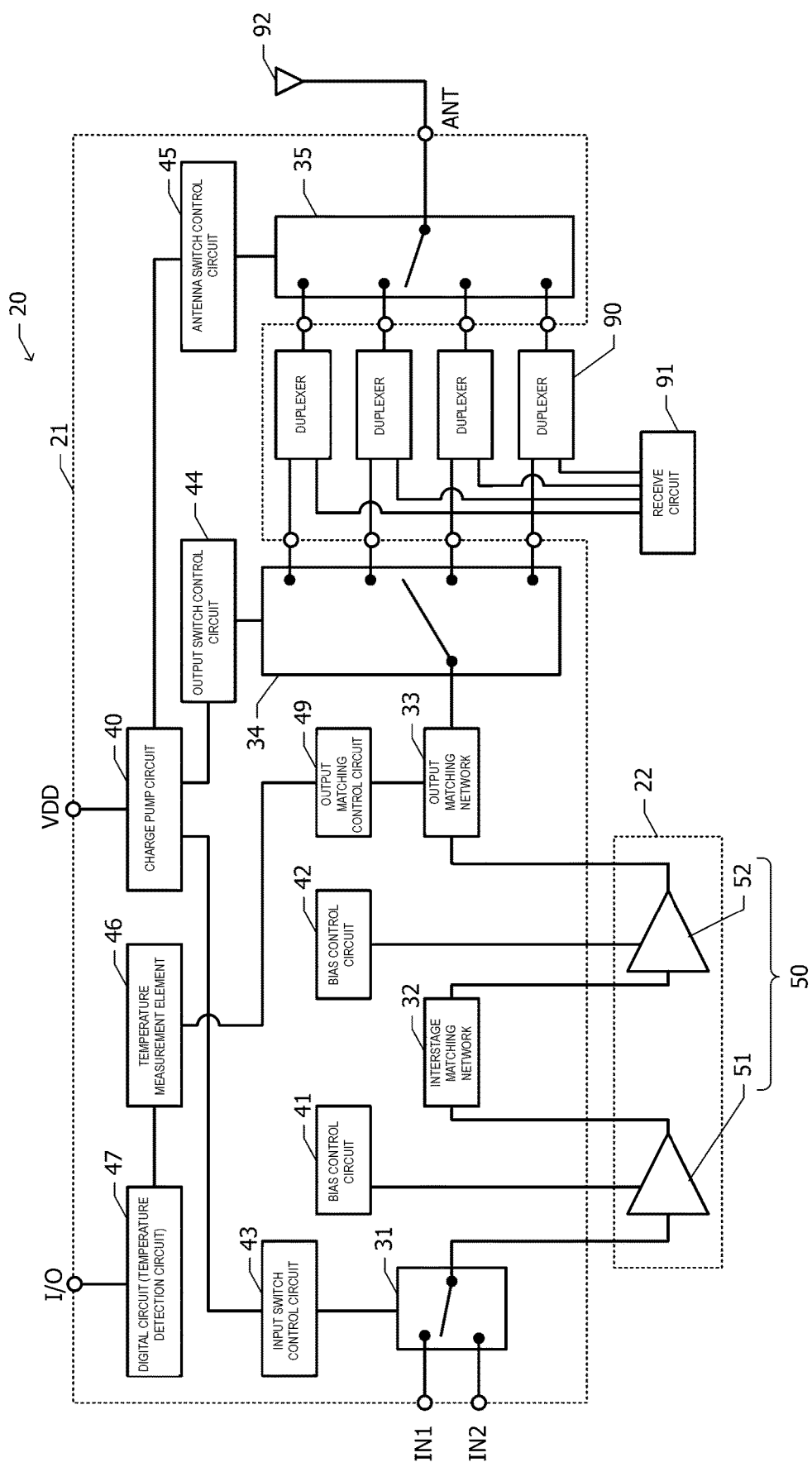
FIG. 14 is a block diagram of the semiconductor device according to an eighth embodiment.

FIG. 14 is a block diagram of the semiconductor device 20 according to the eighth embodiment. In the first embodiment (FIG. 1), an impedance transformation ratio of the output matching network 33 is a fixed value. On the other hand, in the eighth embodiment, the impedance transformation ratio of the output matching network 33 is variable. For example, a switch element is inserted in parallel or in series with at least one passive element included in the output matching network 33. The impedance transformation ratio can be changed by turning on or turning off this switch element. An output matching control circuit 49 controls turning on or turning off of the switch element of the output matching network 33 to thereby change the impedance transformation ratio of the output matching network 33.

Next, advantageous effects of the eighth embodiment will be described. When excessive heat is generated in the transistor Q of the power-stage amplifier circuit 52 by variations in the load impedance as seen from the antenna terminal ANT looking toward an antenna 92 side, the output matching control circuit 49 controls the output matching network 33 to make the impedance as seen from the power-stage amplifier circuit 52 looking toward the load side higher. Thus, the output level of the power-stage amplifier circuit 52 decreases, and destruction of the transistor Q due to an excessive increase in temperature can be inhibited.

The above-described embodiments are merely examples, and it goes without saying that configurations described in different embodiments can be partially replaced or combined. Similar function effects achieved by similar configurations in a plurality of embodiments are not repeatedly described in each embodiment. Furthermore, the present disclosure is not to be limited to the above-described embodiments. For example, it will be obvious to those skilled in the art that various changes, improvements, combinations, and so forth are possible.

What is claimed is:

1. A semiconductor device comprising:
   a first member having a first surface and including a semiconductor region made from an elemental semiconductor;
   a second member joined in surface contact with the first surface of the first member and including a radio-frequency amplifier circuit made from a compound semiconductor; and
   a conductive protrusion projecting from the second member toward a side opposite to the first member,
   wherein the first member includes a temperature measurement element configured to detect a temperature.

2. The semiconductor device according to claim 1, wherein
   the temperature measurement element is disposed at a location where the temperature measurement element overlaps the second member in plan view.

3. The semiconductor device according to claim 1, wherein
   the radio-frequency amplifier circuit includes a plurality of transistors interconnected in parallel,
   the plurality of transistors are arranged in a first direction in plan view, and
   the temperature measurement element is disposed, with respect to the first direction, in a range obtained by extending a range from a transistor at one end to a transistor at another end to both sides by distances between centers of the transistors at both ends and centers of transistors adjacent to the respective transistors at the both ends, and is disposed, with respect to a second direction orthogonal to the first direction in plan view, in a range where the plurality of transistors are disposed.

4. The semiconductor device according to claim 1, wherein
   the first member further includes a temperature detection circuit configured to convert a detected value provided by the temperature measurement element into a digital value and output the digital value to outside the semiconductor device.

5. The semiconductor device according to claim 1, wherein
   the first member further includes a bias control circuit configured to change, by using a detected value provided by the temperature measurement element, a bias current to be supplied to a transistor of the radio-frequency amplifier circuit.

6. The semiconductor device according to claim 5, wherein
   the bias control circuit is configured to perform control to increase the bias current as a temperature detected by the temperature measurement element increases.

7. The semiconductor device according to claim 5, wherein
   when a temperature detected by the temperature measurement element exceeds a predetermined acceptable upper limit, the bias control circuit is configured to stop supply of the bias current to the transistor of the radio-frequency amplifier circuit.

8. The semiconductor device according to claim 1, wherein
   the first member further includes
   an input switch circuit configured to change, through switching of a switch, an attenuation ratio of a radio-frequency signal to be input to the radio-frequency amplifier circuit, and
   an input switch control circuit configured to control the input switch circuit by using a detected value provided by the temperature measurement element.

9. The semiconductor device according to claim 1, wherein
   the first member further includes
   an output switch circuit configured to output, from one output contact selected from among a plurality of output contacts, a radio-frequency signal output from the radio-frequency amplifier circuit, and
   an output switch control circuit configured to control the output switch circuit by using a detected value provided by the temperature measurement element, and
   wherein the output switch circuit includes an impedance adjustment circuit coupled to one of the output contacts.

10. The semiconductor device according to claim 1, wherein
    the radio-frequency amplifier circuit has a multi-stage configuration, and
    the first member further includes
    an interstage matching network inserted between stages of the radio-frequency amplifier circuit and having a variable impedance transformation ratio, and
    an interstage matching control circuit configured to change an impedance transformation ratio of the interstage matching network by using a detected value provided by the temperature measurement element.

11. The semiconductor device according to claim 1, wherein
    the first member further includes
    an output matching network coupled to an output port of the radio-frequency amplifier circuit and having a variable impedance transformation ratio, and
    an output matching control circuit configured to change an impedance transformation ratio of the output matching network by using a detected value provided by the temperature measurement element.

12. The semiconductor device according to claim 2, wherein
    the radio-frequency amplifier circuit includes a plurality of transistors interconnected in parallel,
    the plurality of transistors are arranged in a first direction in plan view, and
    the temperature measurement element is disposed, with respect to the first direction, in a range obtained by extending a range from a transistor at one end to a transistor at another end to both sides by distances between centers of the transistors at both ends and centers of transistors adjacent to the respective transistors at the both ends, and is disposed, with respect to a second direction orthogonal to the first direction in plan view, in a range where the plurality of transistors are disposed.

13. The semiconductor device according to claim 2, wherein the first member further includes a temperature detection circuit configured to convert a detected value provided by the temperature measurement element into a digital value and output the digital value to outside the semiconductor device.

14. The semiconductor device according to claim 3, wherein the first member further includes a temperature detection circuit configured to convert a detected value provided by the temperature measurement element into a digital value and output the digital value to outside the semiconductor device.

15. The semiconductor device according to claim 2, wherein the first member further includes a bias control circuit configured to change, by using a detected value provided by the temperature measurement element, a bias current to be supplied to a transistor of the radio-frequency amplifier circuit.

16. The semiconductor device according to claim 6, wherein when a temperature detected by the temperature measurement element exceeds a predetermined acceptable upper limit, the bias control circuit is configured to stop supply of the bias current to the transistor of the radio-frequency amplifier circuit.

17. The semiconductor device according to claim 2, wherein the first member further includes an input switch circuit configured to change, through switching of a switch, an attenuation ratio of a radio-frequency signal to be input to the radio-frequency amplifier circuit, and an input switch control circuit configured to control the input switch circuit by using a detected value provided by the temperature measurement element.

18. The semiconductor device according to claim 2, wherein the first member further includes an output switch circuit configured to output, from one output contact selected from among a plurality of output contacts, a radio-frequency signal output from the radio-frequency amplifier circuit, and an output switch control circuit configured to control the output switch circuit by using a detected value provided by the temperature measurement element, and wherein the output switch circuit includes an impedance adjustment circuit coupled to one of the output contacts.

19. The semiconductor device according to claim 2, wherein the radio-frequency amplifier circuit has a multi-stage configuration, and the first member further includes an interstage matching network inserted between stages of the radio-frequency amplifier circuit and having a variable impedance transformation ratio, and an interstage matching control circuit configured to change an impedance transformation ratio of the interstage matching network by using a detected value provided by the temperature measurement element.

20. The semiconductor device according to claim 2, wherein the first member further includes an output matching network coupled to an output port of the radio-frequency amplifier circuit and having a variable impedance transformation ratio, and an output matching control circuit configured to change an impedance transformation ratio of the output matching network by using a detected value provided by the temperature measurement element.

\* \* \* \* \*